(12) United States Patent
Bitterlich

(10) Patent No.: US 9,061,799 B2
(45) Date of Patent: Jun. 23, 2015

(54) BOX GRIP

(71) Applicant: ADAM HALL GMBH, Neu-Anspach (DE)

(72) Inventor: Martin Bitterlich, Kelkheim (DE)

(73) Assignee: ADAM HALL GMBH, Neu-Anspach (DE)

( * ) Notice: Subject to any disclaimer, the term of this patent is extended or adjusted under 35 U.S.C. 154(b) by 0 days.

(21) Appl. No.: 13/799,030

(22) Filed: Mar. 13, 2013

(65) Prior Publication Data

US 2013/0264458 A1    Oct. 10, 2013

(30) Foreign Application Priority Data

Mar. 20, 2012   (DE) .................... 20 2012 002 847 U

(51) Int. Cl.
| | |
|---|---|
| *B65D 25/28* | (2006.01) |
| *F16M 13/06* | (2006.01) |
| *H05K 5/02* | (2006.01) |
| *H01L 21/673* | (2006.01) |

(52) U.S. Cl.
CPC ............ *B65D 25/2805* (2013.01); *Y10T 16/44* (2015.01); *Y10T 16/476* (2015.01); *Y10S 16/90* (2013.01); *Y10T 16/4707* (2015.01); *H01L 21/67379* (2013.01); *F16M 13/06* (2013.01); *H05K 5/023* (2013.01)

(58) Field of Classification Search
CPC  H05K 5/023; H01L 21/67379; Y10T 16/476; Y10T 16/513; Y10T 16/4707; Y10T 16/7701; Y10S 16/90
USPC .................. 248/145.6, 682, 311.2, 544, 694; 16/110.1, 424, 425, 426, 430, 446, 16/416, 420, 900; 220/755, 770, 772; 294/15, 27.1, 25; D3/307, 308
See application file for complete search history.

(56) References Cited

U.S. PATENT DOCUMENTS

| | | | | |
|---|---|---|---|---|
| 2,697,539 | A * | 12/1954 | Warner ......................... | 220/318 |
| 3,628,684 | A * | 12/1971 | Sere ............................. | 220/516 |
| 5,392,733 | A * | 2/1995 | Tominaga ..................... | 119/165 |
| 7,108,593 | B2 * | 9/2006 | Janson .......................... | 451/357 |
| 7,275,729 | B2 * | 10/2007 | Sherman et al. ............ | 248/311.2 |
| 7,726,503 | B2 * | 6/2010 | Dygert et al. ............... | 220/23.91 |
| 8,152,012 | B1 * | 4/2012 | Berglund ..................... | 215/396 |
| 2012/0312813 | A1 * | 12/2012 | Voelker ....................... | 220/23.89 |

* cited by examiner

*Primary Examiner* — Tan Le
(74) *Attorney, Agent, or Firm* — Sheridan Ross P.C.

(57) ABSTRACT

A box grip is provided that includes a grip shell with an interior. The box grip may include a grip with a first hand grip arranged in an interior. The grip ring includes a second hand grip and a third hand grip that extend from an upper edge portion of the interior of the grip shell into the interior. This offers the possibility that a user can grip behind the hand grip and also behind the hand grips because the corresponding sections of the grip ring extend into the interior, so that underneath the hand grips one obtains a free space into which a user can grip with his/her fingers.

7 Claims, 5 Drawing Sheets

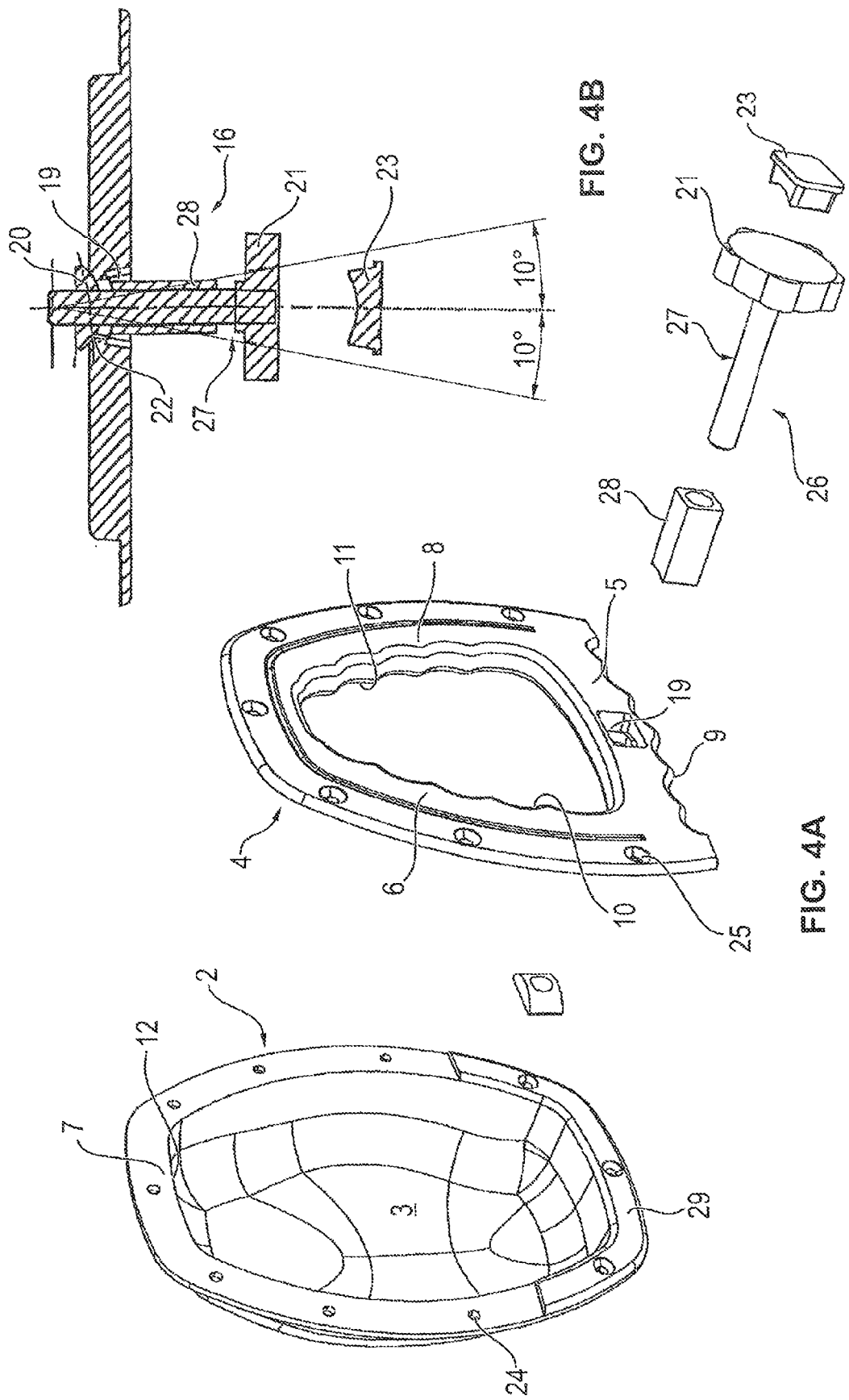

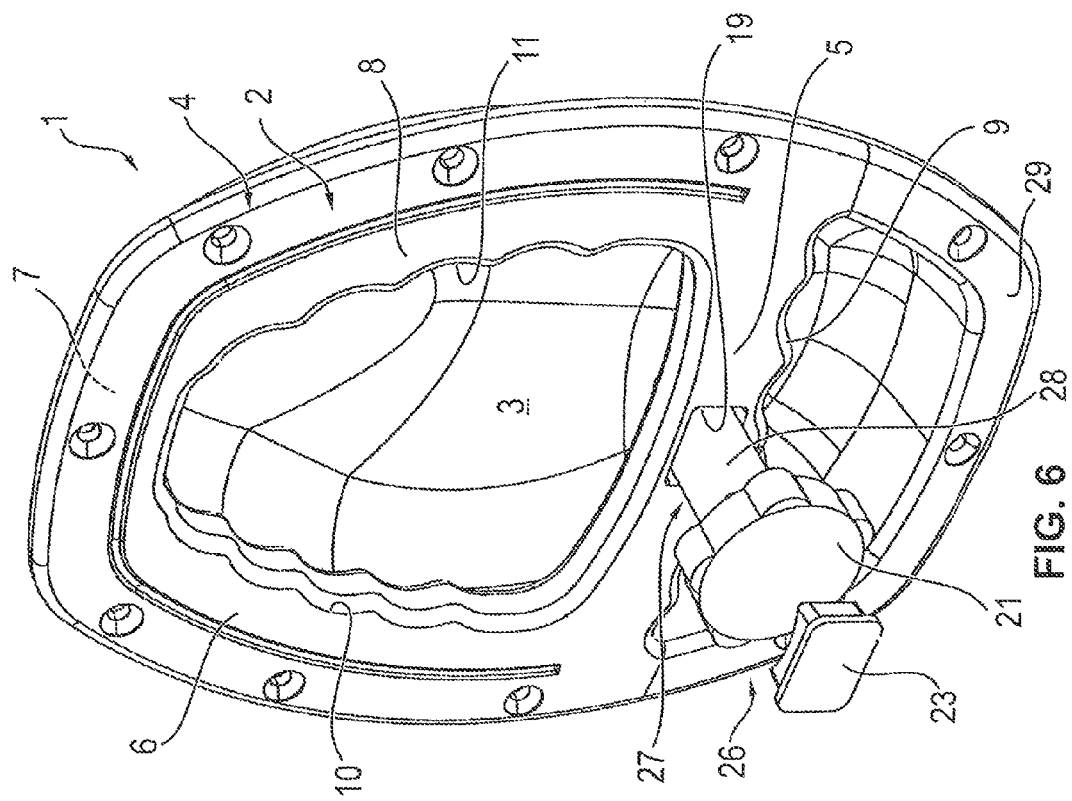
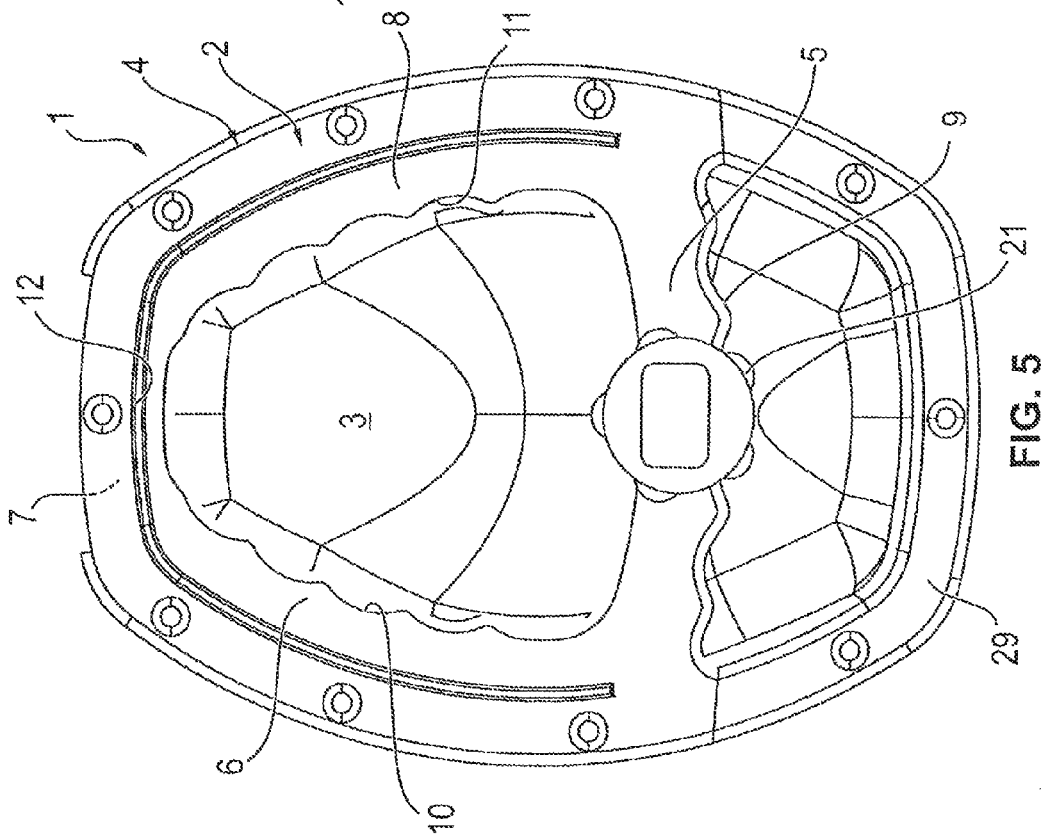

BOX GRIP

This application claims the benefit of German Application No. 202012002847.2, filed Mar. 20, 2012, the entirety of which is incorporated by reference herein.

FIELD OF THE INVENTION

Embodiments of the present invention are generally related to a box grip with a grip shell, which comprises an interior, and a grip ring with a first hand grip positioned in the interior, wherein the grip ring includes at least a second hand grip extending into the interior on the upper edge thereof.

BACKGROUND OF THE INVENTION

A generic box grip poses the problem that the grip ring mounted in the grip shell just comprises a single hand grip which is arranged in the interior of the grip shell. This leads to the drawback that a box provided with the generic box grip can only be handled with difficulty.

It is therefore one aspect of the present invention to provide a box grip that affords considerably improved handling.

BRIEF DESCRIPTION OF THE DRAWINGS

The accompanying drawings, which are incorporated in and constitute a part of the specification, illustrate embodiments of the invention and together with the general description of the invention given above and the detailed description of the drawings given below, serve to explain the principles of these inventions.

FIG. 4A is an exploded illustration of a further embodiment of a box grip according to the invention;

FIG. 4B is a sectional representation through an inclination adjusting means;

FIG. 5 is a top view on the box grip according to FIG. 4A in the mounted state; and FIG. 6 is a perspective representation of the box grip according to FIG. 5.

Figure 1:
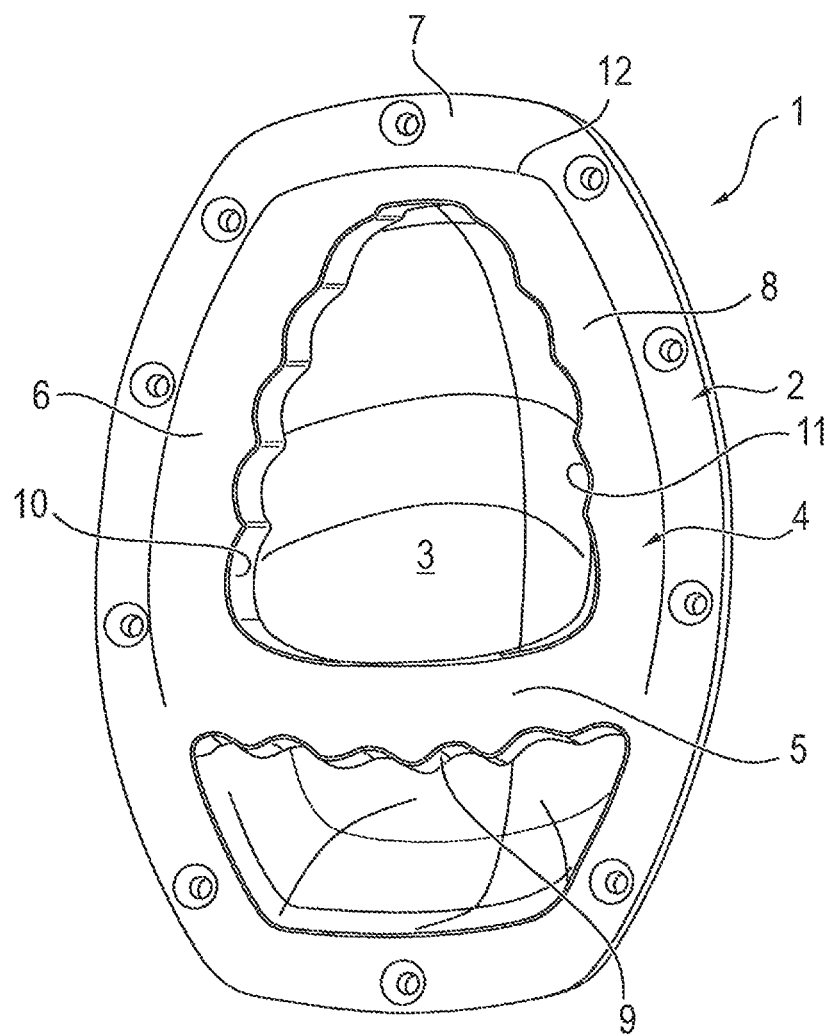
FIG. 1 shows a first embodiment of a box grip according to the invention in a top view.

To assist in the understanding of one embodiment of the present invention the following list of components and associated numbering found in the drawings is provided herein:

| | |
|---|---|
| 1 | Box grip |
| 2 | Grip shell |
| 3 | Interior |
| 4 | Grip ring |
| 5 | Hand grip |
| 6 | Hand grip |
| 7 | Edge section |
| 8 | Hand grip |
| 9 | Finger grooving |
| 10 | Finger grooving |
| 11 | Finger grooving |
| 12 | Upper edge |
| 13 | Mounting means |
| 14 | Mounting eye |
| 15 | Central recess |
| 16 | Internal thread |
| 17 | Front face |
| 18 | Locking |
| 19 | Passage recess |
| 20 | Nut/inclination adjusting nut |
| 21 | Screw head |
| 22 | Contact surface |
| 23 | Lid |
| 24 | Passage recesses |
| 25 | Passage recesses |
| 26 | Inclination adjusting means |
| 27 | Screw |
| 28 | Sleeve |
| 29 | Edge portion |
| B | Box |

It should be understood that the drawings are not necessarily to scale. In certain instances, details which are not necessary for an understanding of the invention or which render other details difficult to perceive may have been omitted. It should be understood, of course, that the invention is not necessarily limited to the particular embodiments illustrated herein.

DETAILED DESCRIPTION

FIG. 1 shows a first embodiment of a box grip 1 according to the invention which comprises a grip shell 2 with an interior 3. The box grip 1 further comprises a grip ring 4 with a first hand grip 5 arranged in the interior 3. Furthermore, in the illustrated embodiment the grip ring 4 comprises a second hand grip 6 and a third hand grip 8 that extend from an upper edge portion 12 of the interior 3 of the grip shell 2 into the interior 3. This offers the possibility that a user can grip behind the hand grip 5 and also behind the hand grips 6 and 8 because the corresponding sections of the grip ring 4 extend into the interior 3, so that underneath the hand grips 5, 6 and 8 one obtains a free space into which a user can grip with his/her fingers.

To improve the handling capability, the hand grips 5, 6 and 8 are each provided with a grooving 9, 10 and 11, respectively.

As illustrated in FIG. 1, the additional hand grips 6 and 8 extend from the hand grip 5 towards a front-sided edge section 7 of the grip shell 2.

It is here fundamentally possible that the grip shell 2 and the grip ring 4 are made integral with each other or that two parts are concerned that are connected to each other, as will be described hereinafter with reference to the embodiment according to FIGS. 4A, 4B, 5 and 6.

Figure 2:
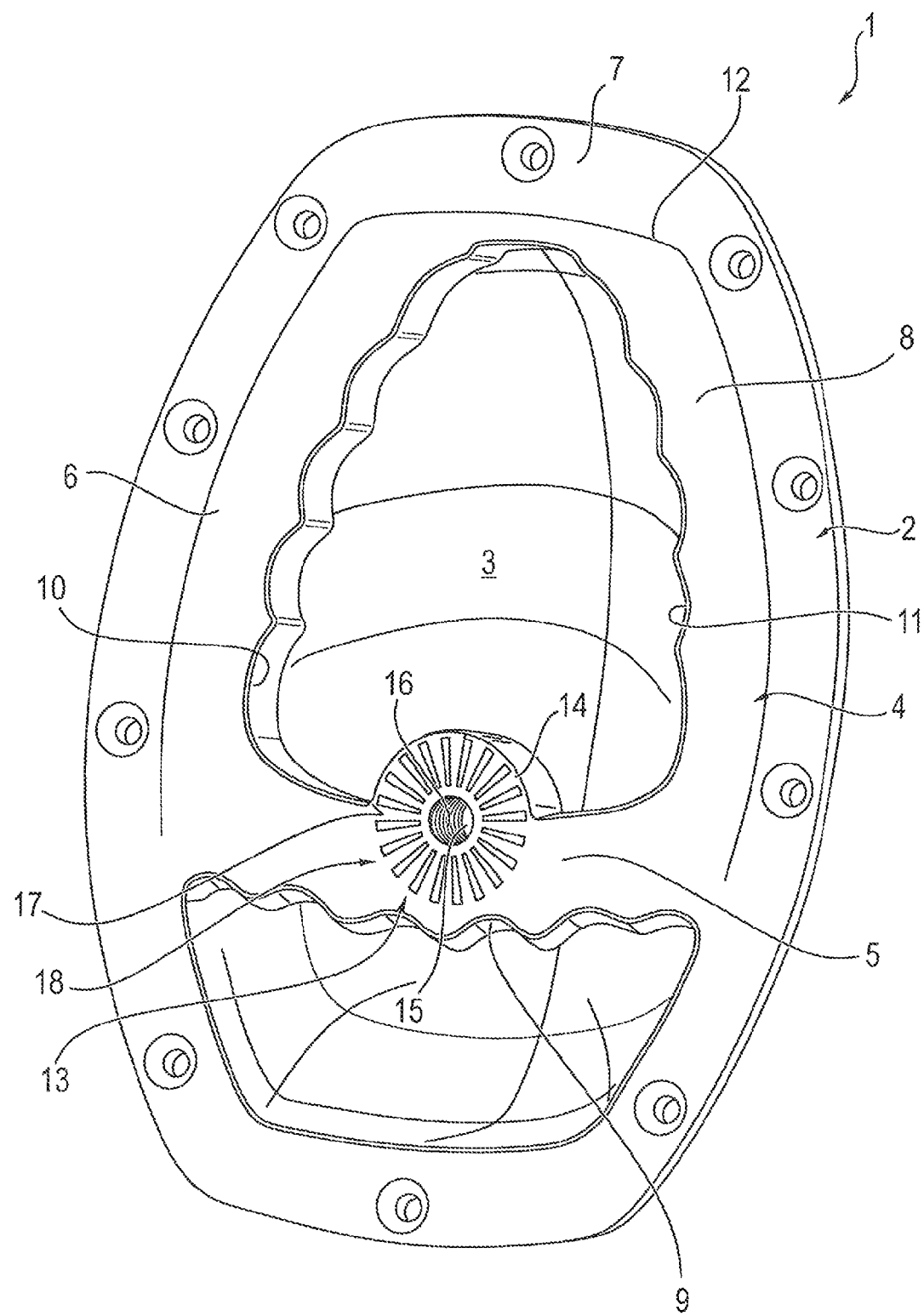
FIG. 2 is a top view on a second embodiment of the box grip according to the invention.

The embodiment according to FIG. 2 substantially conforms to that of FIG. 1, so that reference can be made to the above description with respect to all corresponding parts. The embodiment according to FIG. 2 is distinguished by a mounting means 13 which is integrated into the first hand grip 5.

Figure 3:
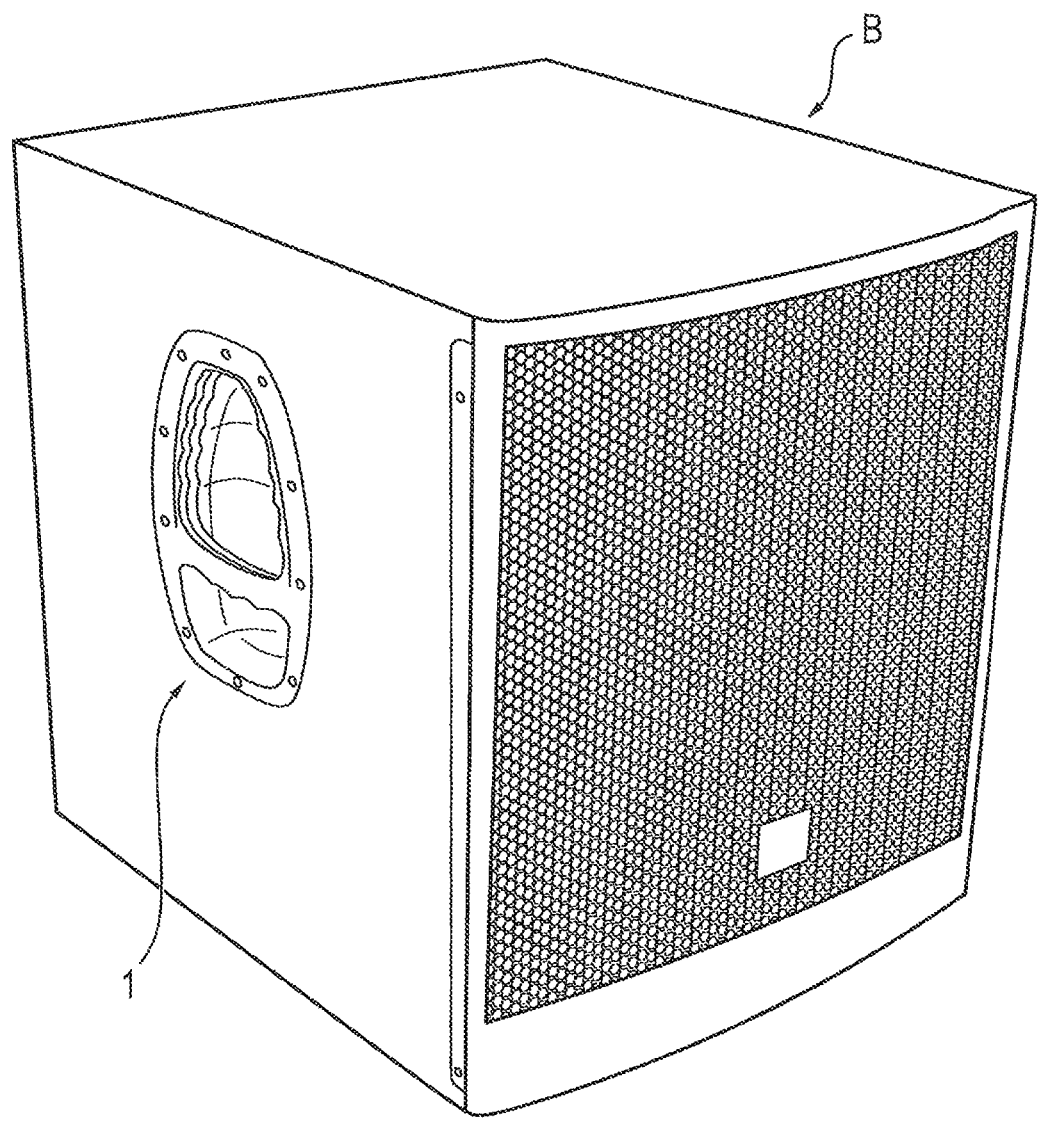
FIG. 3 is a perspective illustration of a box with mounted box grip.

The mounting means 13 comprises a mounting eye 14 integrated in the first hand grip 5 and including a central recess 15. The central recess 15 is provided with a thread 16, and an outwardly oriented front face 17 of the mounting eye 14 is provided with a locking 18. For instance a bracket for a suspension of the box B shown in FIG. 3 may be mounted on said mounting means 13 in cooperation with a screw.

FIG. 4A shows a further embodiment of the box grip 1 according to the invention in an exploded illustration of the components thereof The grip shell 2 corresponds to the embodiment according to FIGS. 1 and 2, with the embodiment shown in FIG. 4A being a construction in which the grip shell 2 is screwed with the grip ring 4 representing a separate part. To obtain a smooth outer surface, the grip shell 2 comprises a raised edge portion 29 for this purpose, the height of said raised edge portion corresponding to the material thickness of the grip ring 4, so that the grip ring 4 is flush with the portion 13 when mounted on the grip shell 2. This becomes apparent from a synopsis of FIGS. 5 and 6, which show the final mounted state.

FIG. 4A illustrates for this that both the grip shell 2 and the grip ring 4 are provided with a plurality of passage recesses, wherein in FIG. 4A the passage recess 24 on the grip shell 2 and the passage recess 25 on the grip ring 4 are marked to be representative of all the recesses; these are of course arranged such that they are each in alignment when the grip ring 4 is mounted on the grip shell 2. This follows from the illustration of FIG. 3 in which the box grip 1 is fixed onto the box B, where a number of screws corresponding to the number of recesses are used and the screws fix both the grip ring 4 on the grip shell 2 and the box grip 1 on the box B in the final mounted state.

Furthermore, the synopsis of FIGS. 4A and 4B reveals the construction of an inclination adjusting means 26 which comprises a screw 27, a sleeve 28, a passage recess 19 in the hand grip 5 of the grip shell 4 and a nut 20.

In the event that the box B is to be fixed by means of a bracket e.g. to a ceiling wall, said bracket can be arranged between the head 21 of the screw 27 and the sleeve 28. Thereupon, the screw 27 is screwed through the sleeve 28 and the passage recess 19 into the nut 20 which comprises a rounded support surface 22 which cooperates with a corresponding mating surface of the passage recess 19. When the screw 27 is loosened, an angular adjustment can be carried out in a range of ±10°, as is plotted in FIG. 4B. When the screw 27 is tightened, the respective position is fixed and the box can be suspended in exact alignment even if the corresponding side surfaces thereof are not exactly plane-parallel. FIG. 4b illustrates for this that the passage recess 19 comprises a slightly conically inclined circumferential surface.

Furthermore, FIGS. 4A and 4B show a lid 23 which is inserted into the recess 19 to cover said recess when no screw 27 is mounted.

As has been explained previously, FIGS. 5 and 6 show the final mounted state of the embodiment according to FIG. 4A in which the grip ring 4 is placed on the grip shell 2 and rests on the edge portion 29.

Apart from the above written disclosure of the invention, explicit reference is herewith made to the drawing of the invention in FIGS. 1 to 6 for the supplementation thereof.

While various embodiments of the present invention have been described in detail, it is apparent that modifications and alterations of those embodiments will occur to those skilled in the art. However, it is to be expressly understood that such modifications and alterations are within the scope and spirit of the present invention, as set forth in the following claims. Further, the invention(s) described herein is capable of other embodiments and of being practiced or of being carried out in various ways. In addition, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

What is claimed is:

1. A box grip, comprising:
    a grip shell, which comprises an interior;
    a grip ring having an interior edge that is defined by a lower edge with an upper edge interconnected thereto, the grip ring comprising a first hand grip extending from the lower edge, and a second hand grip extending from the upper edge;
    a passage recess integrated into the first hand grip;
    an inclination adjusting means operatively interconnected to the passage recess, the inclination adjusting means including a nut positioned in the interior, a sleeve positioned opposite of the nut on an outer surface of the first hand grip, and a screw that is received within the sleeve and selectively interconnected to the nut; and
    wherein the passage recess comprises a slightly conically inclined circumferential surface.

2. The box grip according to claim 1, wherein the second hand grip extends in a direction transverse to the first hand grip up to a front-sided edge section of the grip shell.

3. The box grip according to claim 2, wherein a third hand grip which extends in a direction transverse to the first hand grip up to the front-sided edge section of the grip shell.

4. The box grip according to claim 1, wherein the hand grips are each provided with finger grooving.

5. The box grip according to claim 1, wherein the grip ring is screwed with the grip shell.

6. The box grip according to claim 1, wherein the inclination adjusting means is used to mount a box that the box grip is interconnected to, wherein the inclination adjusting means is adapted to interconnect to a ceiling bracket, wherein the ceiling bracket is adapted to be positioned between the head of the screw and the sleeve.

7. The box grip according to claim 1, wherein the grip ring is made of metal.

* * * * *